United States Patent [19]

Swanson

[11] Patent Number: 5,127,009
[45] Date of Patent: Jun. 30, 1992

[54] METHOD AND APPARATUS FOR CIRCUIT BOARD TESTING WITH CONTROLLED BACKDRIVE STRESS

[75] Inventor: Mark A. Swanson, Arlington, Mass.

[73] Assignee: GenRad, Inc., Concord, Mass.

[21] Appl. No.: 399,853

[22] Filed: Aug. 29, 1989

[51] Int. Cl.$^5$ .................................. G01R 31/28
[52] U.S. Cl. .................................. 371/22.6; 371/22.1
[58] Field of Search ..................... 371/22.6, 22.1; 324/73.1

[56] References Cited

U.S. PATENT DOCUMENTS

| | | | |
|---|---|---|---|
| 3,931,506 | 1/1976 | Borrelli et al. | 371/22.6 |
| 4,194,113 | 3/1980 | Fulks et al. | 371/22.6 |
| 4,459,693 | 7/1984 | Prang et al. | 371/20 |
| 4,555,783 | 11/1985 | Swanson | 371/15 |
| 4,588,945 | 5/1986 | Groves et al. | 324/158 |
| 4,594,558 | 6/1986 | Congdon | 330/9 |
| 4,601,032 | 7/1986 | Robinson | 371/23 |
| 4,620,304 | 10/1986 | Faran, Jr. et al. | 371/20 |
| 4,727,312 | 2/1988 | Fulks | 324/73 |
| 4,774,455 | 9/1988 | Williams | 371/22.6 |
| 4,827,208 | 5/1989 | Oliver et al. | 371/22.6 |

OTHER PUBLICATIONS

Mastrocola, Effective Utilization of In-Circuit Techniques when Testing Complex Digital Assemblies, Automated Testing & Test Measurement, '81 Conference, Weisbaden, Germany, Mar. 23-26, 1981, pp. 106-117.

Primary Examiner—Charles E. Atkinson
Attorney, Agent, or Firm—Cesari and McKenna

[57] ABSTRACT

An automated circuit board testing system, for performing in-circuit, functional or cluster tests, takes backdrive stress into account in selecting appropriate isolation methods for digital devices during the design of the test protocol. In other words, the design of the test includes an analysis of the circuit board and its components, and of the available methods to isolate the device- or function-under-test from the rest of the circuit board. The analysis includes a calculation of stress currents on upstream components resulting from backdriving, and a selection of methods from those available which will produce stress currents below a pre-selected level. In another aspect of the invention, the safe maximum runtime for the test using the available methods is computed.

23 Claims, 9 Drawing Sheets

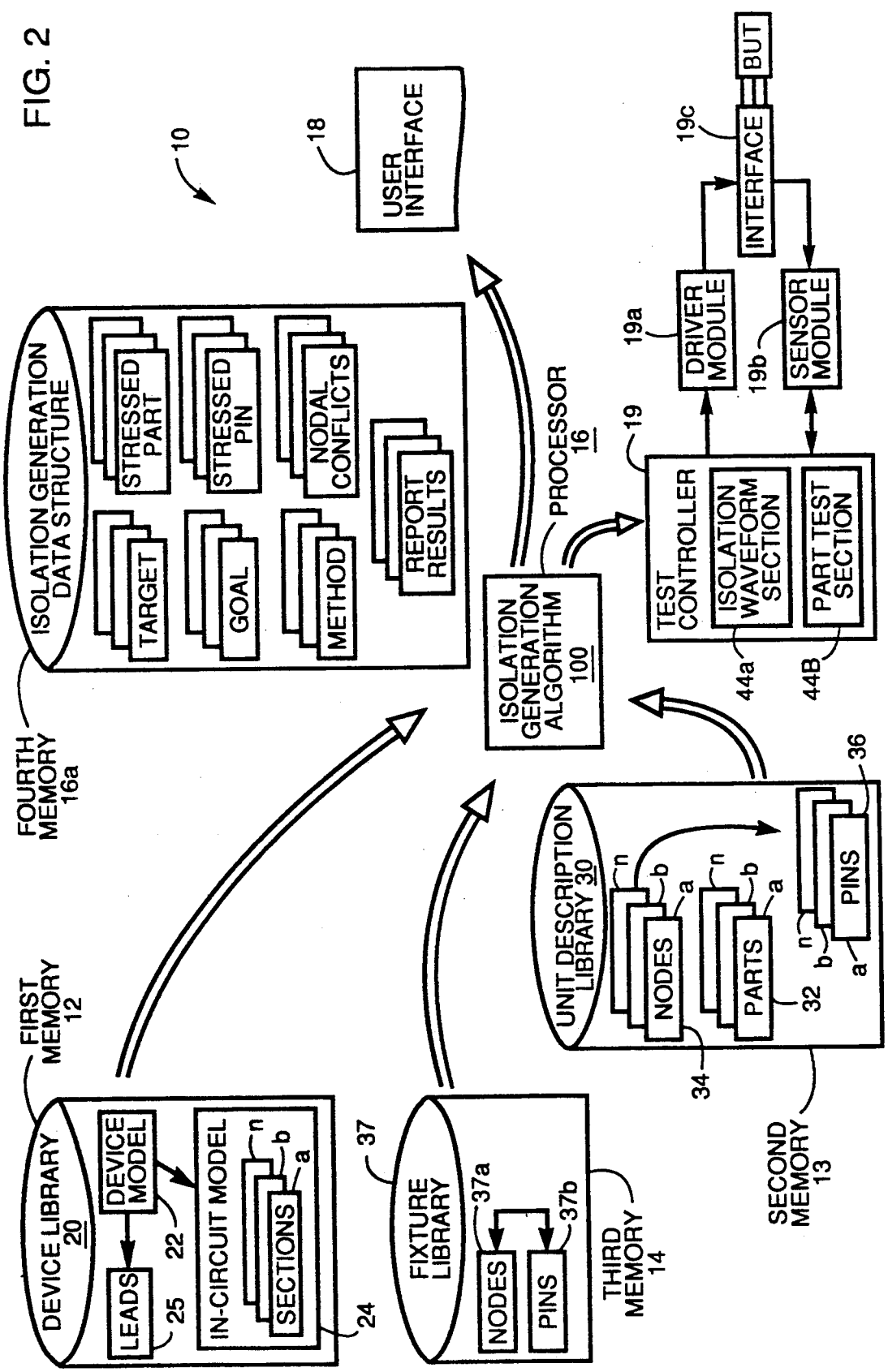

TARGET   A node which is to be protected

| | |
|---|---|
| int id | An identification number for this TARGET |
| NODE *pnode | The node to which this record relates |
| int why | The reason this node requires type protection |
| SET *pgoals | The goals needed to protect this node |

FIG. 4A

GOAL   One or more nodes which must be controlled

| | |
|---|---|
| int ID | An identification number for this goal |
| PART *ppart | The part or parts to which this goal is electrically connected |
| SET *leads | The component leads to which this goal is electrically connected |
| int why | The reason for controlling this goal |
| int priority | The importance of controlling this goal |
| int chosen | -1 if rejected ; if >0, the Method id of method chosen for goal |
| SET *methods | A set of Method ids which could achieve this goal |

FIG. 4B

METHOD    A procedure for placing a part output in a desired state

| | |
|---|---|
| int ID | An identification number for this method |
| SECTION *psec | The description of this method |
| int why | The reason for using this method |
| int chosen | -1 if rejected ; 0 if undecided ; +1 if accepted |
| SET *goals | A set of GOAL ids for which this METHOD is used |

FIG. 4C

STRESSED
PART    Record associated with each part

| | |
|---|---|
| PART *ppart | The part whose backdrive stress is being tracked |
| SET *nodes | The node ids which backdrive this part |
| Iosh_sum | Total stress current (HIGH) on all outputs |
| Iosl_sum | Total stress current (LOW) on all outputs |
| Max_I | Maximum allowable total stress current for part |
| Max_Time | Maximum test time allowed with this backdrive stress |
| SET *stress_lead | A set of IDs of stressed leads associated with this stressed part |

FIG. 4D

STRESSED
LEAD    Record associated with each stressed lead

| | |
|---|---|
| int ID | An identification number for this stressed lead |
| lead ID | Identifies the lead that is being tracked |
| PART *ppart | Identifies the part to which the stressed lead is connected |
| Iosh | Stress current (HIGH) on this stressed lead with currently chosen method |
| Iosl | Stress current (LOW) on this stressed lead with currently chosen method |

FIG. 4E

NODAL_
CONFLICT  Record associated with each nodal conflict

| | |
|---|---|
| NODE *pnode | The node whose conflicting holds are being tracked |
| Int conflicts | The number of hold conflicts |
| SET*HI_methods | Methods which hold this node HIGH |
| SET*LOW_methods | Methods which hold this node LOW |

FIG. 4F

REPORT_
RESULTS    Record of results of Algorithm Calculations

| | |
|---|---|
| SET *stress_part | Specifies for each identified stressed part whether chosen method generates excessive stress |
| GLOBAL MAXTIME | Specifies the GLOBAL MAXTIME for test |

FIG. 4G

METHOD AND APPARATUS FOR CIRCUIT BOARD TESTING WITH CONTROLLED BACKDRIVE STRESS

RELATED PATENTS

This invention is related to those disclosed in the commonly-assigned U.S. Pat. Nos. 4,555,783 (issued Nov. 26, 1985 to Swanson and entitled METHOD OF COMPUTERIZED IN-CIRCUIT TESTING OF ELECTRICAL COMPONENTS AND THE LIKE WITH AUTOMATIC SPURIOUS SIGNAL SUPPRESSION) and 4,459,693 (issued Jul. 10, 1984 to Prang, et al. and entitled METHOD OF AND APPARATUS FOR THE AUTOMATIC DIAGNOSIS OF THE FAILURE OF ELECTRICAL DEVICES CONNECTED TO COMMON BUS NODES AND THE LIKE), which are both incorporated herein by reference.

FIELD OF THE INVENTION

The present invention pertains to automatic testing of electronic circuits, and more particularly to improved test techniques for digital devices.

BACKGROUND OF THE INVENTION

Programmable, computer-controlled instruments and systems for testing printed circuit boards and electronic components thereon are called "automatic test equipment" or "ATE's." ATE's include functional testers and in-circuit testers. A functional tester tests overall functionality of a board-under-test, "BUT," i.e., how the electronic components and circuits of the BUT function collectively. Functional testing of a portion of a circuit board is called "cluster testing." Thus, functional and cluster testers test so-called functions-under-test ("FUT's"). on the other hand, in-circuit testers test individual devices-under-test ("DUT's"). As the name implies, in-circuit testing is performed without the DUT's being physically disconnected from the other electronic components or circuits of the BUT with which they normally are electrically connected.

ATE's are used to detect manufacturing defects, such as short circuits (e.g., a solder bridge between the etched, conductive tracks on the BUT), faulty assembly of electronic components on the BUT, or defective devices themselves.

For instance, in-circuit testers can detect defects in digital logic devices such as integrated circuits ("IC's"). To accomplish such testing, the IC's are exercised and checked against their truth tables. More specifically, the tester applies pre-selected drive signals to inputs of the DUT's, monitors or detects the responses to the drive signals on the outputs of the DUT's, and compares the detected responses with expected or predicted responses for those devices.

To perform in-circuit tests on a fully-assembled printed circuit board, the tester must be able to have access to the circuit nodes on the BUT. "Nodes" are the electrical connections between the leads of electronic components of the BUT, e.g., the etched, conductive tracks on the pc board that extend between various output leads and input leads of electronic components on the BUT.

Electrical access to the circuit nodes on the BUT typically is provided by a test fixture, aptly named a "bed-of-nails"fixture. The "nails" in this fixture typically are a plurality (e.g., hundreds) of probes, each typically being a spring-loaded pin, that electrically contact the nodes on the BUT during testing. Some of the nails supply the drive signals to the BUT, and others receive the response signals from the BUT. The nails are inserted in sockets so located on the fixture as to maintain the nails in registration with the selected circuit nodes with which they are to make electrical connection. Connections between the fixture and the tester are made by wiring the other end of the sockets to electrical connectors in the tester. The physical interface between the fixture and the tester is called the "receiver."

A conventional tester has sets of digital drivers that it uses to drive the IC inputs to desired voltage states, and a set of digital sensors to check the logic levels at the IC outputs. These drivers and sensors typically form driver/sensor testing pairs ("D/S"), in which the output of a driver is tied to the input of an associated sensor. In this way, BUT nodes contacted by the D/S pairs each can be either driven by a current supplied by the driver or tracked, i.e., have its current sensed by the sensor of the D/S pair. Drivers and sensors preferably are separately controllable by the tester.

When a D/S pair is used to place an IC input in a desired voltage state, the driver is enabled (connected) and a suitable voltage is applied to the IC input. Then, the sensor of another D/S pair is enabled to sense the response to that drive signal at an IC output.

For example, if the IC were a NAND gate having two inputs N0, N1 and an output N3, and if it were desired to apply a HIGH level to both inputs while checking the output for a LOW level, the following test patterns could be followed: a) the drivers of the D/S pairs, which are associated with the test nails which, in turn, are connected to inputs N0, N1, are enabled, b) a voltage selected to place these inputs N0, N1 in the HIGH state is applied to those drivers, c) the sensor of each of the D/S pair, which is associated with the tester nail which, in turn, is connected to output N3, is enabled, and d) the sensor is controlled to check for a LOW output from the NAND gate.

To fully test all possible combinations of input values and the resulting output value for the NAND gate, of course, would require four tests, as indicated by the following truth table for the NAND gate:

| N0 | N1 | N3 |
|------|------|------|
| LOW | LOW | HIGH |
| LOW | HIGH | HIGH |
| HIGH | LOW | HIGH |
| HIGH | HIGH | LOW |

Thus, for this simple circuit having a single DUT, four tests can be performed, each of which entails the driving of two nodes (connected to inputs N0, N1) and the sensing of a third node (connected to output N3). Of course, actual PC boards typically have a large number of electronic components, many of which can have multiple inputs and outputs, so the tests can be quite complex.

Such complex digital tests routinely are conducted with presently manufactured testers, typically at speeds faster than the testers' central processing units ("CPU's") can control in real time. Therefore, the CPU's typically load series of test patterns into memory banks. Then, to start the tests, the CPU's enable high-speed controllers, which transfer the test patterns to the drivers and store the responses detected by the sensors in the memory banks. After the test procedures are completed, the CPU's transfer the results of the tests from the memory banks to main memory for later analysis.

An additional complication arising in in-circuit testing is test isolation. Driven nodes (i.e., circuit interconnections) on the pc board typically are connected not only to the inputs of the DUT's but also to inputs and/or outputs of other electronic components. Consequently, many electronic components on the pc board, in addition to DUT's, typically are energized simultaneously by the drive signals. The tester must be able to electrically isolate each DUT from the other electronic components to which they are electrically connected. Analog devices are isolated, e.g., by conventional techniques collectively referred to as "guarding." Digital devices typically are isolated by a process known as "backdriving."

Backdriving can be understood with continued reference to the example given above. Suppose the test requires that input N1 be held HIGH, but further suppose that input N1 is connected to a node which the output of another IC, called an "upstream" or "predecessor" device, ordinarily would be driving to a LOW value. The tester can handle this conflict in logic states by momentarily forcing N1 to the desired HIGH state regardless of the state to which it is being held by the upstream IC. This technique of momentarily overriding an IC output is called "backdriving." In other words, backdriving is the process of forcing the output of an up-stream digital device to a logic level different from that to which the digital device is "trying" to drive it.

Typically, backdriving is carried out by applying to a node (called a "controlled node") a backdriving current that exceeds the drive capacity of the device to whose output the node is connected, and thus is sufficient in amplitude to change the voltage state of that node. By controlling the state of the controlled node, the DUT's input node or nodes (called "protected nodes") are placed in desired logic states. Often, the controlled nodes are those which are connected immediately between the outputs of up-stream electronic components and the inputs of the DUT's. When that is the case, the controlled nodes are also protected nodes. Other times, the controlled nodes are other nodes of the BUT, e.g., nodes connected to the inputs to the upstream electronic components. When that is the case, for example, the backdriving currents cause the inputs of those upstream electronic components to assume values that result in outputs at the desired voltage levels, and, these voltage levels are applied to the protected nodes leading to the inputs of the DUT's. In other words, the backdriving signals applied to upstream electronic components propagate through the circuit and eventually yield the desired state on the protected nodes.

The generation of an appropriate backdriving strategy or methodology is important to the success of the testing of the digital devices. For example, consider what can happen when a DUT is connected as part of a feedback loop. For instance, take the situation of a conventional toggle flipflop circuit configured as follows: the Q output of a J-K flip-flop is connected in a feedback loop through input N0 of a NAND gate back to the clock input of the flip-flop, while a HIGH value is applied to input N1 of the NAND gate, and the J and K inputs of the flip-flop are tied to a LOGIC ONE, so that the Q output of the flip-flop toggles to an opposite state whenever a positive going transition is applied to the clock input. It would be desirable to test this circuit by initially clearing the flip-flop, contacting a driver to the node leading to the clock input, placing the clock input in a LOW state, applying a HIGH value to the clock input, and checking the output of the flip-flop to assure that it properly changes state.

However, when this test is run, the sudden change in the flip-flop output (HIGH to LOW) elicited by the drive signals immediately feeds back a LOW signal to the clock input. However, this LOW signal soon is overcome by the drive signal which restores that input to a HIGH value. Thus, the clock input, and the node connected to it, experience a momentary dip in voltage, known as a "glitch." (A "glitch" is any small, spurious pulse or spike, regardless of polarity.) The glitch can cause the flip-flop to toggle back to the state it was in before the test, depending on the size and duration of the glitch. If this happens, the tester may conclude that the flip-flop did not toggle and, therefore, failed the test. An appropriate backdriving strategy therefore is necessary to avoid the generation of the glitch, and, thereby, the erroneous test results.

Another example of the many test situations requiring a special backdriving strategy is the testing of bused devices, i.e., several digital devices all having outputs connected to a common bus. The tester must check each device individually to see if each one can control the logic state of the bus. Unfortunately, since the device outputs are all tied together, any defective device could force the bus to an erroneous state at which, for example, the bus would remain despite an output from another of the devices which normally would place the bus in a different state. In other words, the bus is "stuck" in the erroneous state. The problem is to identify which, if any, of the electronic components is the defective one.

The strategy by which backdriving currents are applied to isolate DUT's, such as those in the above examples, is called the "isolation protocol." The isolation protocol consists of a plurality of isolation methods, one for each DUT. Each isolation method is a procedure for placing one or more outputs of an IC that is up-stream from the DUT being isolated into a specified logic state by driving one or more inputs of that IC (or of a device up-stream from that IC) into selected logic states or a sequence of selected logic states.

When a specified protected node is to be placed in a desired logic state, one or more isolation methods may be available to accomplish this task. From the perspective of the specified protected node, each such available method entails the identification of a set of nodes to be controlled in order to protect the specified protected node, and the specification of backdriving currents required to effect that control.

As is known in the art, there are numerous different types of methods that can be employed to isolate any particular DUT. Generally speaking, these types of isolation methods can be classified in accordance with the way they achieve the isolation, and typically fall into one of several classes—— e.g., inhibits, disables, H-forces, and L-forces. An inhibit method prevents a glitch from propagating into the output so as to keep the output constant, and, normally, to drive the output into the weaker state. (For example, in transistor-transistor logic ("TTL"), an inhibit method attempts to drive the output into the HIGH state which is typically the weaker state.) A disable method forces an output into an OFF state. An H-force method forces the output into a HIGH state, while an L-force method forces the output into a LOW state.

The selection of which of the available types of isolation methods to use is made by analyzing the BUT's topology and the characteristics of the electronic components contained thereon. Of course, where a BUT has a plurality of protected nodes, a plurality of isolation methods may be selected for implementation during testing, each isolation method causing one or more of the protected nodes to assume the desired logic state therefor.

In the examples described above, to protect against unwanted glitches in the flip-flop circuit, the tester inhibits the NAND gate in the feedback loop, thereby eliminating the glitch-sensitive feedback signal and permitting the glitch-free testing of the flip-flop. (Generally speaking, as discussed in the above-referenced U.S. Pat. No. 4,555,783, to protect against unwanted glitches during a test, a tester typically disables all tri-state electronic components (i.e., digital devices having outputs that can be HIGH, LOW, or a high-impedance state) by placing them in their high-impedance state, and inhibits all other electronic components (except for the DUT's) by forcing their inputs to a state that effectively inhibits their operation.)

The protocol for testing the common bus example, given above, to determine which device is defective and is keeping the bus stuck in one state, entails disabling all of the devices (e.g. by placing them in their high impedance state) and measuring the bus current, then enabling each device separately, one at a time, applying logic inputs to the enabled devices that tend to drive the bus to that one state, and measuring the resulting bus currents. If the bus current changes significantly, the enabled device is not faulty, but if the current remains substantially the same as when the device was disabled, then that device is regarded as faulty. Backdriving strategies for the common bus scenario are discussed in the above-referenced U.S. Pat. No. 4,459,693.

A further understanding of methods of isolation can be had by reference to a paper entitled "Effective Utilization of In-Circuit Techniques When Testing Complex Digital Assembles," written by Aldo Mastrocola, GenRad, Inc. of Concord, Massachusetts, U.S.A., presented at the Automatic Testing and Test and Management '81 Conference, Wiesbaden, West Germany in Mar., 1981, and incorporated herein by reference. Also, testing equipment for digital devices employing backdriving for isolation are commercially available from GenRad, Inc., Concord, MA.

Thus, the isolation needed for accurate and reliable in-circuit testing is achieved by using a combination of methods of applying backdrive currents to the BUT, which methods collectively constitute the isolation protocol for the BUT. However, backdriving currents can present their own problems in testing pc boards.

These backdrive currents generally are of greater amplitude than, and are directed in the opposite direction with respect to, the currents normally flowing in the controlled nodes. Consequently, the up-stream devices with respect to those nodes experience reverse currents that flow into the up-stream devices through their output power leads. The effects of these currents on the up-stream devices is called "backdrive stress." While these currents often do not present a problem, the rise in temperature attributable to these currents can cause damage to the up-stream devices, i.e., under certain conditions the up-stream devices can experience excessive backdrive stress.

In conventional in-circuit testing, fixed cool-down intervals of pre-determined length commonly are introduced between the pulses or bursts of the driving signals in order to reduce adverse temperature effects of excessive backdrive stress, e.g., by permitting the devices to cool to room temperature.

Another known technique is to use variable (instead of fixed) cool-down intervals. An example of this technique is disclosed by U.S. Pat. No. 4,588,945 issued to Groves. In accordance with that patent, records containing topological descriptions of the BUT, and pre-generated generic test patterns for the DUT's, are provided. A topological analyzer sorts through these records, selects patterns which are suitable for testing each DUT, and supplies these patterns to a damage analyzer. The damage analyzer receives the selected test patterns and calculates the time the test will require, and, using safeguard parameters stored with the topological records, calculates the length of the inter-burst times necessary to avoid damage to up-stream components that would otherwise occur. Thus, apparently, the safeguard parameters are not used in selecting the test patterns, but, rather, they are used only after the test patterns are selected, in the calculation of the cool-down periods. Subsequently, a test controller applies the test patterns to DUT's through a driver module, inserting the calculated inter-burst delays when and where appropriate.

Generally, circuit board testing is recognized as a significant part of quality assurance programs. Improvements in the reliability, safety, efficacity, efficiency and economics of circuit board test and diagnostic techniques represent marked advances in the manufacture of electronic products of high quality. Recent trends toward higher-powered logic families and larger IC's with many parallel outputs (e.g., gate arrays) have made more evident the problems of excessive backdrive stress resulting from such testing.

SUMMARY OF THE INVENTION

The invention resides in improved automatic testing equipment and systems for performing in-circuit, functional or cluster tests which take backdrive stress into account in selecting appropriate isolation methods——e.g., inhibits, disables, H-forces, and L-forces—— during the generation of the test protocols. The generation of each test protocol includes an analysis of the circuit board and its components, and of the available methods to isolate the device- or function-under-test from the rest of the circuit board. The analysis includes a calculation of "total stress current" flowing in each upstream component to determine if these currents are below a safety threshold (e.g., 1 ampere), and the selection of a combination of methods from those available which (among other considerations) will produce total stress currents below this threshold.

"Stress current" is the incremental increase in current flowing into an output power lead of a component due to backdriving. The stress currents resulting from backdriving the power leads HIGH, each symbolized as "$I_{osh}$," all flow through the device to, e.g., the $V_{cc}$ lead. The stress currents resulting from backdriving the power leads LOW, each symbolized as "$I_{osl}$," all flow through the device to, e.g., ground. The "total stress current" is the greater of the resulting currents flowing through the $V_{cc}$ and ground leads.

It was recognized that the principal damage mechanism that determines whether a particular method or combination of methods would result in excessive backdrive stress is IC bond wire over-heating, and such overheating depends on the amplitude of the stress currents. Bond wires are the small conductors within the IC packages that connect the semiconductor chips to the components' leads. For example, the $V_{cc}$ bond wire connects the chip to the $V_{cc}$ lead, and the ground bond wire connects the chip to the ground lead.

Backdrive stress generally will not damage the upstream devices as long as the total stress currents flowing through the $V_{cc}$ and/or ground bond wires have amplitudes and durations below safe limits. However, if the backdrive stress resulting from the chosen methods of isolation is excessive, i.e., the total stress current flowing through the $V_{cc}$ and ground bond wires are above a safety threshold for one or more devices on the BUT, damage to those devices can result from the test. Therefore, as mentioned above, the calculation of total stress currents that would result from implementing the available methods of isolation of a BUT are calculated and the resulting value is used in selecting the isolation methods to be used in running the test. A suitable value for the safety threshold has been found to be 1 ampere, although an even higher threshold can be used for some devices.

Having selected methods of isolation which produce total stress currents under the safety threshold, the system then can proceed to use the selected methods in running the test. On the other hand, if all combinations of the methods produce excessive backdrive stress, the test equipment alerts the operator of this condition.

Preferably, however, and in accordance with another aspect of the invention, a maximum length of time under which the test can run safely is calculated before running the test. This is called "GLOBAL MAXTIME." More specifically, GLOBAL MAXTIME is an approximation of the minimal length of time before which the calculated total stress currents would overheat the $V_{cc}$ and ground bond wires of the up-stream IC's. Thus, the methods of isolation are chosen to assure that the stress currents are below a selected maximum amplitude as described in the preceding paragraphs, and, then, the GLOBAL MAXTIME is calculated to assure that the effects of the calculated total stress currents over time will not damage the up-stream devices were those selected methods implemented.

If the test can not be run in a period of time under the GLOBAL MAXTIME, it would be unsafe to run the test. On the other hand, if the test can be run in a period of time under the GLOBAL MAXTIME, the test as generated by the system can safely proceed. For example, if the GLOBAL MAXTIME is approximately 7 milliseconds, the test typically can be successfully run.

Consequently, it can be seen that an optimal isolation protocol is generated in which excessive backdrive stress is eliminated, or the user is afforded the opportunity to take measures to permit the test (or a modified version of the test) to be run safely. Effectively, the invention provides an automated backdrive stress management and control system for in-circuit, functional, and cluster testing of printed circuit boards.

Each test run by the improved ATE in accordance herewith is characterized by an inter-burst time period equal to the time it takes to load the next test to be performed. This time period typically is of sufficient length to allow the temperature to decline to approximately ambient temperature. It should be emphasized, however, that the invention does not use the inter-burst cool-down interval, as in the prior art, as the control variable to eliminate the adverse temperature effects of excessive backdrive stress. Rather, the invention uses calculations for the stress currents, themselves, in the design of the test to eliminated the potential for excessive backdrive stress during the running of the test.

The invention accordingly comprises the features of construction, combination of steps, and arrangement of parts which are exemplified in the illustrative embodiment hereinafter set forth, and the scope of the invention will be indicated in the appended claims.

BRIEF DESCRIPTION ON OF THE DRAWINGS

The above and further advantages of the invention may be better understood by referring to the following description in conjunction with the accompanying drawings, in which:

FIG. 2 is a simplified block diagram of an automated system for testing circuits, such as that of FIGS. 1A and 1B, in accordance with the invention;

Figure 3A:
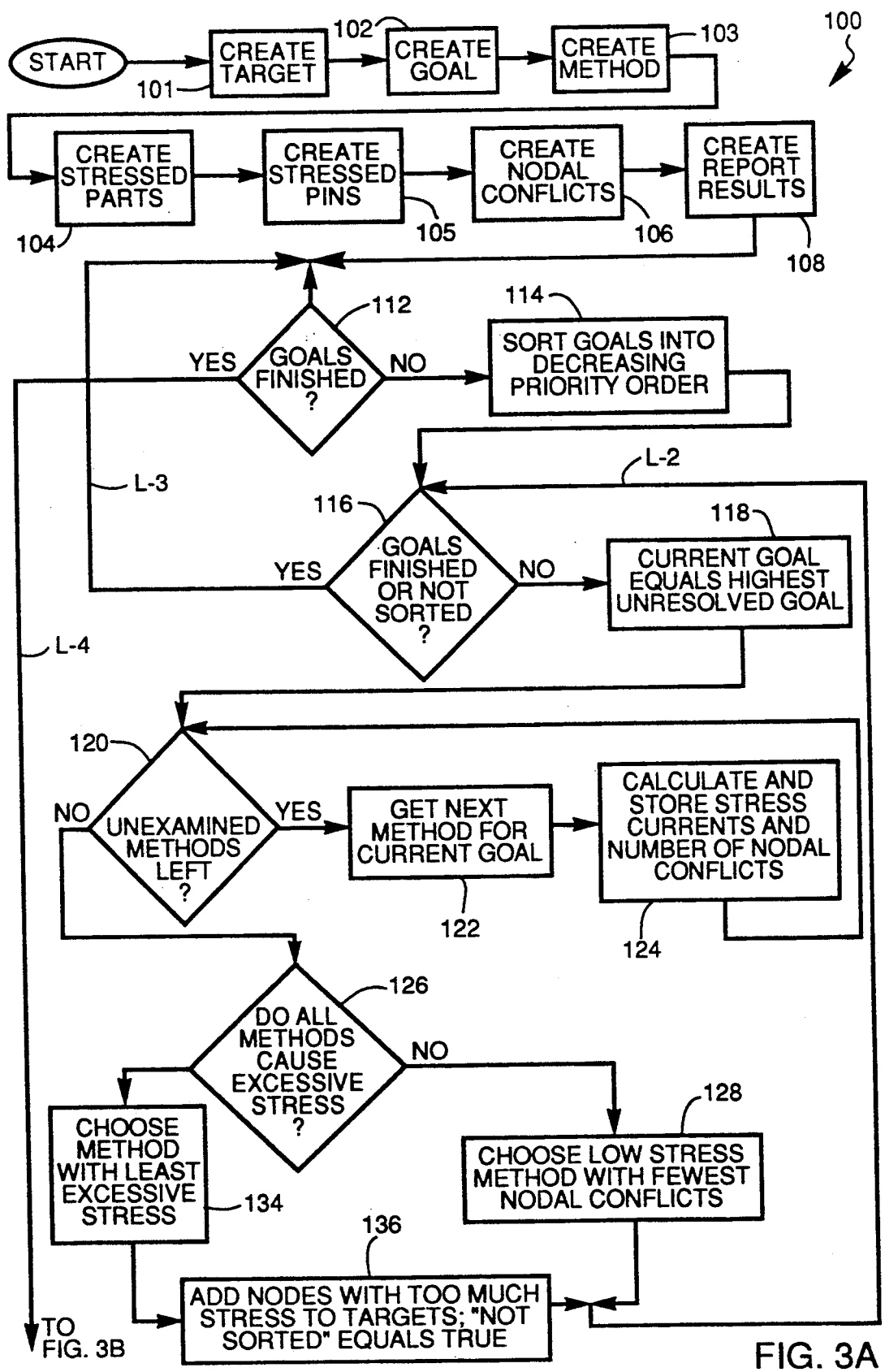
Figure 3B:
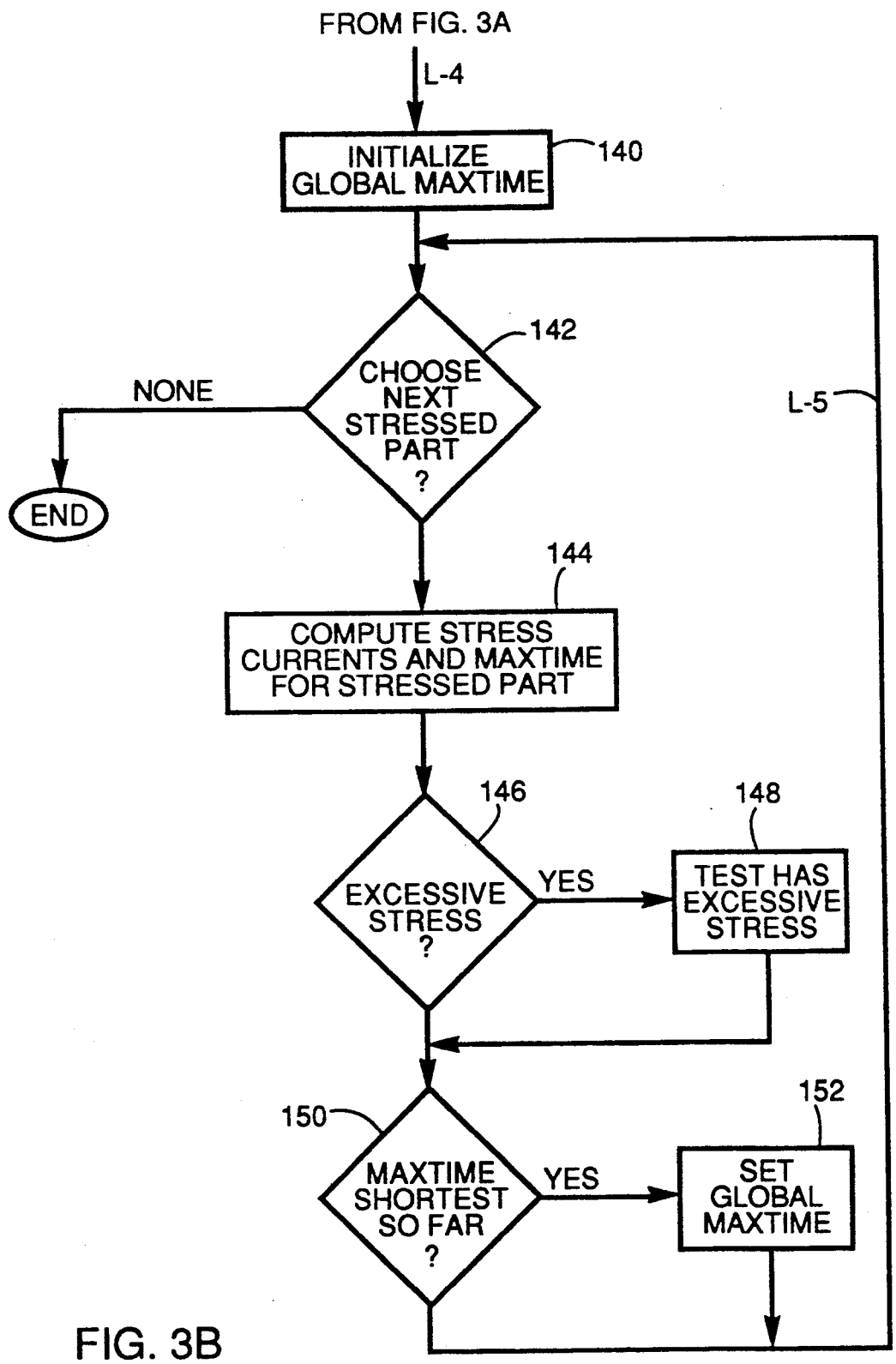

FIGS. 3A and 3B together are a flow chart depicting an algorithm for generating an optimal test isolation protocol for the system of FIG. 2; and FIG. 4A–4G, inclusive, are block diagrams respectively showing the format of the TARGET, GOAL, METHOD, STRESSED PART, STRESSED LEAD and NODAL CONFLICT data structures used in the algorithm of FIG. 2.

DESCRIPTION OF THE PREFERRED EMBODIMENT a. Analysis of Exemplary Boards-Under-Test

Figure 1A:
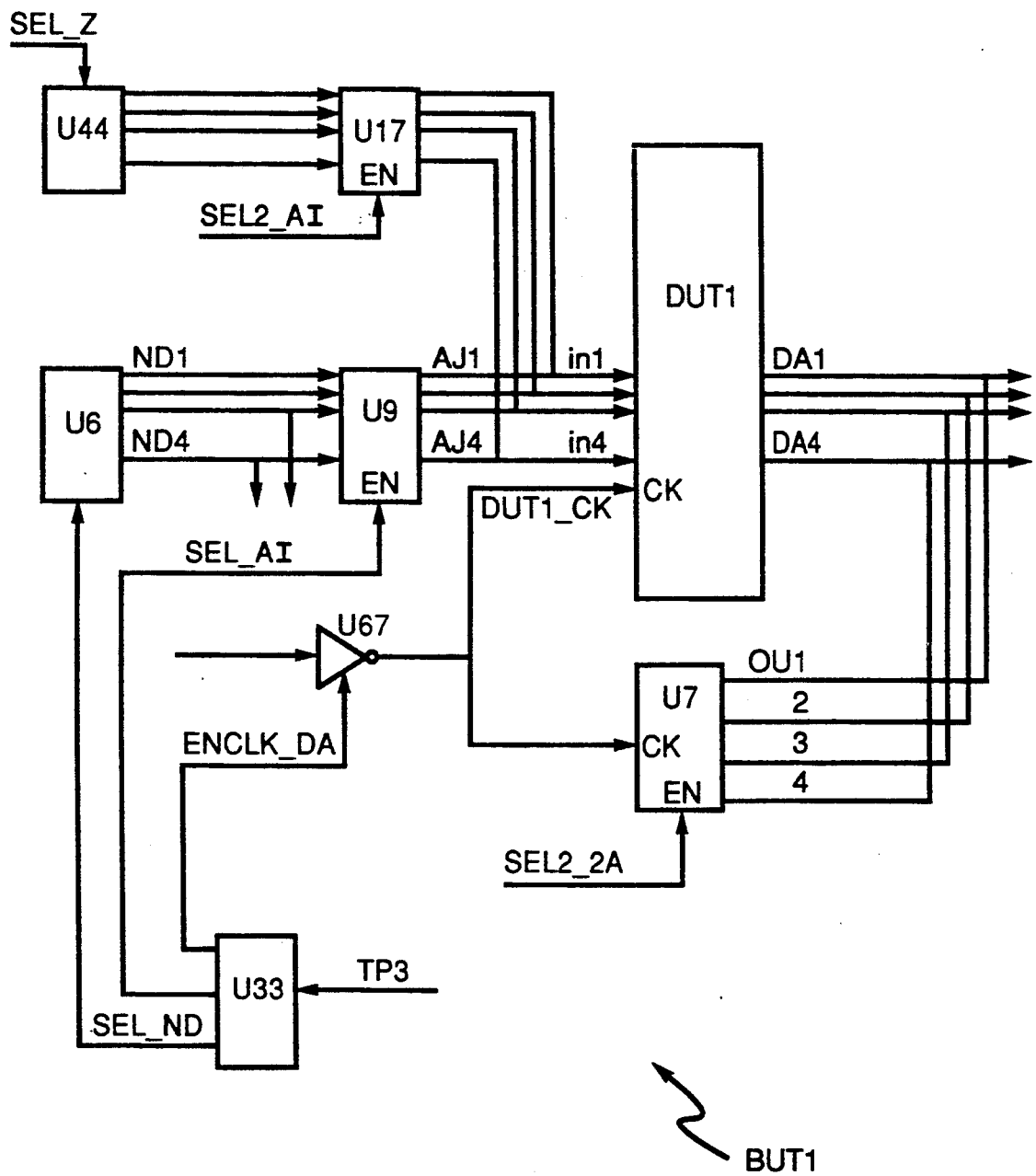
FIGS. 1A and 1B are block diagrams of illustrative circuits to be tested in accordance with the invention.
Figure 1B:
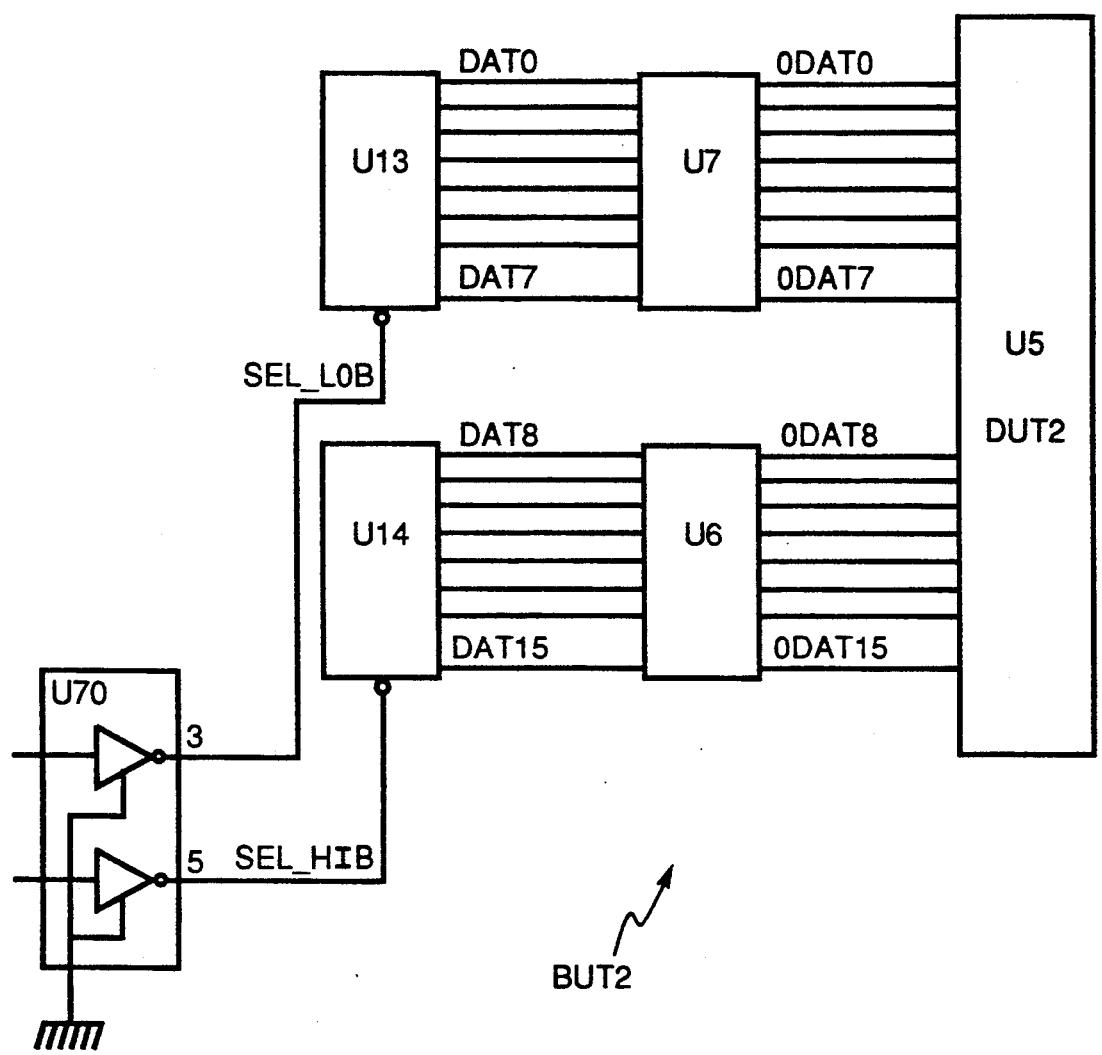

An appreciation of the invention can be had by considering the BUT examples which are shown in FIGS. 1A and 1B, and which are to be tested in accordance with the invention.

In the illustrated circuit BUT1 of FIG 1A, an integrated circuit DUT is to be in-circuit tested. Electronic devices U9 and U17 are up-stream devices with respect to DUT1, i.e., devices having one or more outputs electrically connected to one or more inputs of DUT1. In turn, U6 is up-stream of U9, U44 is up-stream of U17, inverter U67 is upstream of both DUT1 and U7, and U33 is up-stream of U6, U9 and U67.

Initially, the topology and electronic components or parts of BUT1 are analyzed. For example, for reasons explained in the above-referenced U.S. Pat. No. 4,555,783, since the outputs DA1...DA4 of DUT1 are electrically connected to the outputs OU1...OU4 of U7, U7's outputs are disabled during testing of DUT1. In addition, since a glitch, i.e., transient spike, on line DUT1-CK could cause test difficulties, U67 is disabled or inhibited to prevent glitch propagation to the DUT-CK input of DUT1. However, glitches on the AI1...AI4 lines will not cause such test difficulties since it is unlikely that such glitches will occur at critical times during testing.

To achieve the desired isolation, several alternative isolation methods can be utilized. For instance, the outputs of U17 and U9 can be disabled or U9 and U17 can be inhibited. To illustrate the invention, the analysis of different methods of disabling the outputs of U17 and U9 will be presented. A similar analysis of methods of achieving the inhibiting of U9 and U17 can be derived by those skilled in the art.

The circuit analysis to achieve the desired disabling is as follows—— First, an analysis of circuit topology yields an identification of nodes available for backdriving. For example, one method of achieving the disablement is to use nodes SEL$_{13}$ AI and SEL2_AI (i.e., the enable inputs of U17 and U9) to disable (e.g., tri-state) the outputs of U17 and U9. It is possible that U17 cannot be disabled in this way, however, because SEL2_AI is unavailable. This situation would arise, for instance, either if SEL2_AI had to be placed in a conflicting logic state in order to test DUT1 (which would give rise to a "nodal conflict" or "holding conflict"), or the signal driving SEL2_AI were too strong to be backdriven without damaging up-stream devices (not shown) driving that line.

On the other hand, if the more direct or "brute force" approach were used, that of backdriving U17's outputs so as to change each of their signals from LOW to HIGH, the backdriving stress, i.e., the net currents on U17 could be excessive.

A technique for reducing the currents required to backdrive U17 involves controlling the nodes connecting U44 to U17 in order to generate better (i.e., more easily backdriven) output signals from U17. For example, U44's outputs could be backdriven to force U17's outputs to the weaker "HIGH" state, which would protect U17 by avoiding the need for the application of the higher backdriving currents to the U17 outputs.

Unfortunately, the stress currents into U44 resulting from this method could be excessive. An alternative to backdriving the U44 outputs is to drive its enable input SEL_Z to disable U44's outputs.

Similarly, SEL_ND, SEL_AI and ENCLK_DA could be driven to disable the respective outputs of U6, U9 and U67. While each of the resulting stress currents in SEL_ND, SEL_AI and ENCLK_DA individually might be at a safe level, the total stress current experienced by U33 could be excessive. If this were the case, it could be avoided by driving the TP3 line LOW to protect U33. On the other hand, if TP3 were not available for this purpose, U33's outputs could be driven into a weak (HIGH) state to avoid the difficulty; however, if the signals present on the U33 inputs were too strong, then a testability problem would be present.

It is apparent from the foregoing example that various methods can be used to disable the outputs of U17 and U9. The selection of which disabling method is optimal entails the identification of which nodes are to be backdriven, the calculation of the stress currents on up-stream devices connected to those lines, and an assessment of whether the calculated backdrive stresses are safe.

The nature of these calculations can be more fully appreciated from the following analysis of BUT2 depicted in FIG 1B. In that drawing, DUT2 is the device-under-test. DUT2 and devices U6, U7, and U70 are, e.g., IC's designated SN74LS240 and made by Texas Instruments, Dallas, TX, USA. Devices U6, U7 drive DUT2 over respective lines ODAT0 through ODAT7 and ODAT8 through ODAT15. Device U13 drives device U7 over lines DAT0 through DAT7, and device U14 drives device U6 over lines DAT8 through DAT15. Devices U13, U14 are both, e.g., SN74ALS374 IC's, made also by Texas Instruments. Finally, device U70 drives U13 over line SEL-LOB, and drives U14 over line SEL-HIB.

In this example, lines ODAT0 through ODAT15 are nodes that are to be protected, i.e., placed or maintained in preselected states, e.g., LOGIC LOW values, for testing, regardless of the states to which these lines are being driven by up-stream devices U6, U7. Because of this, the lines ODAT0 - ODAT15 are regarded as "target nodes," or simply "targets." A direct approach would be to apply drive signals directly to the targets ODAT0 - ODAT15 to force these lines into the desired states. For the sake of this example, suppose that this direct approach can not be used because of glitch sensitivity in lines ODAT0 - ODAT15. Consequently, a remote approach is followed in which the lines DAT0 - DAT0 15 are used instead as the controlled nodes, and must be driven to HIGH values in order to obtain the desired states on ODAT0 - ODAT15. The identification of protected nodes, the controlled nodes, and the desired logic states on these nodes collectively constitute a method of isolation.

Next, it is appropriate to calculate the stress currents that would result from implementing the above-mentioned direct backdriving method. When the lines DAT0-DAT7, DAT8-DAT15 attempt to drive the TARGETS ODAT0 through ODAT15 to a LOW state, the incremental increase in current being carried by each of the TARGETS DAT0 through DAT15 is called $I_{osl}$. This current is calculated for this example by appropriately adding (or subtracting) the currents normally flowing in each controlled node and the backdriving currents applied thereto.

More specifically and generally speaking, values for $I_{osh}$ and $_{osl}$ are determined as follows: If an output from the device is disabled, both $I_{osh}$ and $_{osl}$ equal to zero for the output; if held HIGH by both the tester drive signals energizing the device for the test and the selected methods of isolation, $I_{osh}$ equals zero for the output; and if held LOW by both the tester drive signals and the selected methods of isolation, $_{osl}$ equals zero for the output. On the other hand, if the output from the device is driven to opposite states by the tester drive signals and the methods of isolation, the values for these currents must be calculated based on the manufacturers' specifications for the device and the amplitude of backdriving currents supplied by the tester. This calculation is well within the skill in the art.

Let us assume that $_{osl}$ is equal to $-0.225$ ampere for each output DAT0 through DAT15. Since there are eight of these outputs for each device U13, U14 that are all being driven LOW, the value for $_{osl}$ is multiplied by eight to yield a total stress current, i.e., a total incremental power lead current, for either device U13 or U14 of $-1.8$ amps.

Generally speaking again, as described above, the total stress current for a device is the greater of the sum of the $I_{osh}$ values for the device and the sum of the $_{osl}$ values for the device.

It has been found that 1 ampere is a safe threshold for the total stress current. Therefore, the calculated stress current for this example of $-1.8$ amps. is excessive, and excessive backdrive stress would result if this method of isolation were implemented.

Consequently, in accordance with the invention, the nodes DAT0-DAT15 are added to the list of nodes to be protected, i.e., are considered additional target nodes, and the afore-mentioned method of isolation is deemed inappropriate unless further action is taken. As such further action, and in order to protect nodes DAT0-DAT15, input lines SEL_LOB and SEL_HIB of devices U13, U14 can be driven so as to force each output DAT0-DAT7 and DAT8-DAT15 to either a high-impedance or HIGH state.

A method of accomplishing this entails driving both the nodes SEL_LOB and SEL_HIB to HIGH states. This turns off the respective outputs DAT0-DAT7 and DAT8-DAT15 of U13 and U14, so $_{osl}$ is equal to zero for each lead of U13 AND U14, and the stress currents in U13 and U14 are reduced to zero.

It is now necessary to consider the effects upon U70 of holding these nodes SEL_LOB and SEL_HIB in HIGH states when they would normally be driven LOW. If $I_{osh}$ for each line SEL_LOB and SEL_HIB is calculated to be equal to 0.240 amps., the total stress current flowing into U70 is 0.48 amps., which is less than the 1.0 amp. safety threshold. Thus, this method of isolating and testing DUT2 does not produce excessive backdrive stress.

Next, it is appropriate to calculate how long it would take to overheat the bond wires of U70 at these stress current levels. Since this time limit for each device determines whether the test can be safely run without adverse temperature effects, it must not be exceeded in running the test. In other words, the duration of the test must be under this time limit, which is called MAX-TIME. An equation for calculating an approximation for the time limit, which can be derived by those skilled in the art, is as follows:

$$MAXTIME = (T/k) [1/(I_b)^2]$$

where "T" is the maximum safe temperature to which the bond wires can be heated, which typically is 250° C.; "k" is an empirically derived constant having a value of 36,000 for bond wire materials and lengths used in conventional IC packages; and "$I_b$" is the stress current, equal to the sum of $I_{osh}$ values for nodes being backdriven to a LOGIC HIGH state and to the sum of $_{osl}$ values for nodes being backdriven to a LOGIC LOW state. A typical value for MAXTIME for the given example is 30 milliseconds. This is regarded as a sufficient length of time to conduct this incircuit test.

b. Automated System for Circuit Testing

FIG. 2 shows an improved automatic test equipment or system 10 for generating an optimal test isolation protocol for a BUT, such as either of those shown in FIGS. 1A or 1B, and for using that protocol for testing the BUT. The system 10 has a first memory 12, a second memory 13, a third memory 14, a processor 16, a fourth memory 16a, a user interface 18, a test controller 19, a driver module 19a and a sensor module 19b. An interface unit 19c electrically connects the tester modules 19a, 19b to the nodes of the BUT. The interface unit 19c preferably includes a bed-of-nails fixture and a receiver, neither of which being separately shown in FIG. 2. The memories 12, 13, 14 and 16a can be implemented separately or as sections of a main memory.

The first memory 12 stores a device library 20. The device library includes a device model 22, an in-circuit model 24, and a device leads table 25. The device model 22 is a table listing operational parameters and specifications for a plurality of commercially-available electronic devices (e.g., output currents, maximum reverse currents, and values of resistors, capacitors, ...) as specified and published by manufacturers.

It will be understood that, for some BUT's, many electronic components thereon can be implemented using the same electrical device, i.e., a product sold by a particular manufacturer and having a particular set of specifications. The electronic components of the BUT will be referred to hereinbelow as "components" or "parts," while the specific products of a manufacturer will be referred to as "devices."

The in-circuit model 24 contains a plurality of sections 24a, 24b,...24n, which contain information and data concerning the methods—— e.g., inhibits, disables, H-forces, and L-forces—— by which various digital devices described in the device model library can be isolated during testing. In other words, in the in-circuit model 24, commercially available IC are cross-referenced with a set of methods available (at least in theory) for isolating that IC. It should be understood that not all methods listed in the in-circuit model 24 will be available for testing the BUT however. Some methods might be unavailable for particular IC's, or particular applications of particular IC's, e.g., because of wiring conflicts. For instance, if a method required that a certain line on the IC be driven LOW, and on the BUT that line is tied solidly to the high power rail, it can not be driven LOW. Consequently, that method is unavailable for isolating that particular IC.

The device leads table 25 identifies the leads of the electrical devices lists in the device model 22.

The device model 22, each of the in-circuit model sections 24a-24n and the device leads table 25 constitute separately accessible records stored in locations of the first memory 12. A better understanding of the contents of the first memory 12 will be obtained from the discussion of FIG. 3 and FIGS. 4A-4F, below.

The second memory 13 stores BUT descriptions 30, i.e., descriptions of circuit topology of the BUT. The BUT descriptions includes a parts table 32 which describes the components (e.g., gates, multiplexors...) contained in the BUT, a nodes table 34 which lists the nodes on the BUT, and a leads table 36 which lists the BUT component leads, and, for each, identifies the nodes or nodes to which it is electrically connected. Each of the parts, nodes, and leads tables 32, 34, 36 contains a plurality of separately accessible records (designated by a suffix a,b,..n added to the respective reference numeral) stored in locations of the second memory 13.

The third memory 14 stores a fixture library 37, i.e., data concerning the interface unit 19c. The fixture library 37 contains a nodes table 37a and a tester pins table 37b. The nodes table 37a cross-references each node of the BUT to the tester pin or pins (i.e., nail or nails), if any, which it contacts during testing. On the other hand, the tester pins table 37b cross-references each tester pin (i.e., nail) to the node which it contacts during testing.

The processor 16 receives selected sections 24 and selected entries from the device leads table 25 from the first memory 12, selected entries from the parts, nodes and leads tables 32, 34, 36 from the second memory 13, and selected entries from the nodes table 37a and tester pins table 37b from the third memory 37, all of which are associated with the BUT, and processes this data in accordance with a test isolation generation algorithm 100 (which is described in considerable detail in conjunction with FIGS. 3 and 4A-4F) to yield data that is supplied to the user interface 18 and/or to yield a test protocol that is supplied to the test controller 19. The fourth memory 16a, coupled to the processor 16, stores data structures (described below) generated by the processor 16.

The user interface 18 receives the resulting data from the processor 16. It either converts the data from machine readable form to human readable form, or stores it for later use. The user interface 18 preferably can display on a cathode ray tube ("CRT"), or print out in tangible form, a stress report and/or warnings concerning the level of backdrive stress or test run-time.

In accordance with the invention, the processor 16 also provides information concerning the optimal test protocol to the test controller 19. The test controller 19 is shown in FIG. 2 as including an isolation waveform section 44a responsible for controlling the test patterns (i.e., waveforms) to be supplied to the BUT in accordance with the isolation protocol computed by the processor 16. These patterns are characterized by safe levels of stress currents for isolation of devices on the BUT. The test controller 19 also has a part test section 44b responsible for processing the response signals from the DUT's.

The outputs from sections 44a, 44b are supplied to the tester driver module 19a, which provides drive signals to the BUT. A tester sensor module 19b receives response signals resulting from the drive signals from the BUT and also receives expected response signals from the test controller 19, and provides, to the test controller 19, signals indicating whether the expected response signals, in fact, were received. The tester modules 19a, 19b can be implemented using the driver/sensor amplifier circuit disclosed in U.S. Pat. No. 4,594,558 entitled "HIGHSWITCHING SPEED D.C. AMPLIFIER WITH INPUT-OFFSET CURRENT COMPENSATION," and issued Jun. 10, 1986.

c. Isolation-Generation Algorithm

FIG. 3 shows an isolation generation algorithm 100, represented in flow chart form, for use by the processor 16 in generating an optimal isolation protocol (sometimes also called an "isolation procedure," "isolation strategy" or "isolation methodology"). The algorithm 100 differs from the prior art in that it adds backdrive stress to the considerations that determine the preferred isolation protocol. In other words, the algorithm 100 identifies a particular set of test isolation methods—— e.g., inhibits, disables, H-forces, and L-forces—— which, when used in running the test, maintain stress currents at acceptable levels, and thereby eliminate excessive backdrive stress. For any reason, if the algorithm 100 is unable to identify test methods which avoid excessive stress currents, and which can be performed within necessary time constraints for running the test, the algorithm 100 appropriately cautions the user accordingly.

The algorithm 100 is entered at block 101 with preselected lists of DUT's and of nodes to be protected. The list of nodes is used as a reference into the nodes table 32 of memory 13 (FIG. 2) for fetching information from which algorithm 100 forms a table of TARGETS, i.e., an associated list of data structures or records stored in memory 13 that identify and describe nodes to be protected. (Whenever the name of a record is used hereinafter, it will be in all capital letters to distinguish it from the circuit features to which such records pertain, which will be in lower case letters.) A separate TARGET record is created for each such node.

Thus, in the example of FIG. 1B, lines 0DAT0 – 0DAT15 are targets, and for each of these a TARGET record is created.

A preferred format for a TARGET record is shown in FIG. 4A as including an "int id" field which provides an identification number for this TARGET, a "NODE *pnode" field which identifies the node to be protected (i.e., the target), an "int why" field which identifies the reason for protecting this node (as determined by the algorithm 100 from an analysis of the DUT Description Library 30), a "SET *pgoals" field which identifies the set of GOALS (described below) required to protect this target.

In block 102, a table called GOALS is created by fetching appropriate data corresponding to the TARGETS from the leads table 36 of second memory 13 (FIG. 2). GOALS are data structures which each describe a node that is to be controlled by the test controller 19 (FIG. 1) in order to protect the TARGETS. A separate GOAL record is created for each such node.

Thus, in the example of FIGURE 1B, the lines DAT0 – DAT15 are goals to be controlled in order to protect the targets 0DAT0 – 0DAT15.

A preferred format for a GOAL record is shown in FIG. 4B as including an "int Id" field which provides an identification number for this GOAL, a "PART *ppart" field which identifies the component or components of the BUT to which this goal is electrically connected, "SET *leads" field which identifies a set of component leads to which this GOAL is electrically connected, an "int why" field which identifies the objective for this GOAL (as determined by the algorithm 100 from an analysis of the DUT Description Library, e.g., to protect a specified node for specified reasons), an "int priority" field which specifies the importance of meeting this GOAL (described below), an "int chosen" field which later has a value of NEGATIVE ONE if rejected (i.e., the goal is not controlled during testing), and a value greater than ZERO if the "Method id" field of METHOD (described below) indicates that a method is chosen which entails controlling the logic value on this GOAL, and a "SET *methods" field which contains a set of identifications for methods of isolation selected by algorithm 100 which include controlling the logic value on this goal.

Next, in block 103, a table called METHODS is created by fetching the methods from the in-circuit model table 24 of the first memory 12 (FIG. 2) which can isolate the devices of the BUT which drive the goals (i.e., the nodes described in the GOAL records). The METHODS table contains data structures that describe methods—— e.g., inhibits, disables, H-forces, and L-forces—— for isolating DUT's on the BUT, and thereby controlling the goals. Separate METHOD records are created for each method identified as available in the in-circuit model 24 for protecting any one or more of the goals. In other words, the METHODS records contain data pertaining to methods of isolation that are available for commercially available IC's and each method can protect one or more nodes on the BUT. From the available methods, the algorithm 100 selects the optimal one for each TARGET, and analyzes the affects of implementing that selected method on each other protected and controlled node, as will be explained shortly.

A preferred format for a METHOD record is shown in FIG. 4C as including an "int Id" field which provides an identification number for this METHOD, a "SECTION *psec" field which describes the method, e.g., nodes that are protected using this method, nodes that are controlled using this method, amplitude of backdriving currents (as determined by the algorithm 100 by analyzing the in-circuit model 24 (FIG. 2), with due consideration of the BUT topology described in the BUT description library 30 and the contents of the fixture library 37), an "int why" field of entries each corresponding to a GOAL identifying this method, each entry gives the most important (i.e., highest) reason for each GOAL to need this METHOD, an "int chosen" field of entries each corresponding to a GOAL identifying this method, each entry later having a value of NEGATIVE ONE if this method of isolation is rejected by algorithm 100, POSITIVE ONE if this method is accepted for implementation in controlling the goals, and ZERO if the algorithm neither accepts nor rejects this method, and a "SET *goals" field which contains a set of GOAL id's requesting this METHOD.

Referring now to block 104, another set of data structures prepared by algorithm 100 are the STRESSED PART table, which contains information stored in the PARTS table 34 of memory 13 and the device model 22 of first memory 12. Each of these data structures later will store the results of various calculations (with respect to the particular electronic components of the BUT) that are performed during the remaining steps of the algorithm 100.

A preferred format for a STRESSED PART record is shown in FIG. 4D as including a "PART *ppart" field which identifies an electronic component of the BUT whose backdrive stress is being tracked, a "SET *nodes" field which gives the node ids for those nodes at which the tester is currently backdriving this electronic component, a "Iosh_sum" field which will store a calculated total stress current flowing through the $V_{cc}$ bond wire of this part, an "Iosl_sum" field which will store a calculated total stress current flowing through the ground bond wire of this part, a "Max_I" field which contains the maximum allowable total stress current for this electronic component (i.e., typically 1 ampere), a "Max_time" field which will store a calculated maximum test time allowed at the values of total stress currents given in the Iosh_sum and Iosl_sum fields for the methods selected for implementation, and a "set *stressed_leads" field which provides a set of id's of STRESSED LEADS (described below) associated with this stressed part.

In block 105, a STRESSED LEAD table is created, and data fetched from the leads table 25 of memory 13. It lists leads of the parts on the DUT, and, in association with each listed lead that is backdriven and with each method of isolation involving backdriving one or more of the listed leads, the table also provides values for $I_{osh}$ and $I_{osl}$.

A preferred format for a STRESSED LEAD record is shown in FIG. 4E as including a "int ID" field which provides an identification number for this STRESSED LEAD; a "lead ID" field which identifies the component lead that is being tracked; a "PART *ppart" field which identifies the electronic component of the BUT to which this lead is attached; an "Iosh" field which specifies the calculated stress current on this lead resulting from backdriving HIGH, i.e., $I_{osh}$; and an "Iosl" field which specifies the calculated stress current on this lead resulting from backdriving LOW, i.e., $I_{osl}$.

Next, in block 106, a NODAL CONFLICT table is formed so that it is available for insertion of data later generated in algorithm 100. A preferred format for a NODAL CONFLICT record is shown in FIG. 4F as including a "NODE *pnode" field which specifies a node whose conflicting logic states are being tracked, an "Int conflicts" field which specifies the number of hold conflicts on this node, a "SET *HI_methods" field which identifies the methods which hold this node HIGH, and a "SET *LOW_methods" field which identifies the methods which hold this node LOW.

In block 108, a REPORT-RESULTS table is formed so that it is available for insertion of the results of the algorithm 100. A preferred format for the REPORT-RESULTS table is shown in FIG. 4G as including a "set *stress_part" field which specifies whether the chosen method or methods generate excessive stress for each stressed part identified in the STRESSED PART data structure, and a "GLOBAL MAXTIME" field which specifies the GLOBAL MAXTIME calculated for the test when the chosen methods are implemented.

The TARGET, GOAL, METHOD, STRESSED PART, STRESSED LEAD, NODAL CONFLICT and REPORT-RESULTS tables for the BUT are all stored in fourth memory 16a (FIG. 2), and the algorithm 100 next processes this information in a series of nested loops.

At step 112, the algorithm 100 tests whether all GOALS records have been processed. If the answer is NO, then the next step is described in block 114 as a sort—— GOALS records are sorted, i.e., ranked, in decreasing order of priority based on the contents of the "int priority" field of the GOAL record. The algorithm does this since the various reasons for protecting the TARGET vary in importance, and it may not be possible to protect all nodes that should be protected. In determining which ones will be protected, therefore, the algorithm ranks the GOALS in the order of their importance, and processes them in the order of their ranking.

In a preferred embodiment, the GOALS are ranked in descending order of priority, for example, as follows:
1. Goal drives a node which is driven by DUT (e.g., shared output bus nodes);
2. Goal is driven by part whose inputs are driven by protected node (i.e., local feedback around DUT);
3. Goal is to be driven to a selected logic state to avoid excessive backdrive stress, as determined by isolation algorithm;
4. Goal driven by an upstream part output lead at a current which is to high to be backdriven by tester (e.g., output of 3 amps while maximum drive signal from tester is 1 amp.);
5. Goal driven by up-stream part which is device known (e.g., empirically) to oscillate when backdriven;
6. Goal is driven by output of up-stream part which is a member of a digital device family whose members are known (e.g., empirically) to oscillate when backdriven (even though it is not known whether the up-stream device itself oscillates when backdriven; and
7. Goal is connected to a DUT input lead which is glitch sensitive.

Note that one or more additional GOALS can be added during subsequent steps of the algorithm 100, as indicated by item (3) in the ranking and as explained below. If GOALS are added, the GOAL sorting step to be repeated.

Next, the algorithm 100 at decision block 116 checks whether all GOALS records have been sorted, or have been fully processed, i.e., finished. If the answer is NO, (i.e., either further sorting or processing is required) one of the GOAL's that have been assigned the highest priority which has not as yet been fully processed is selected as the current GOAL in step 118. (Goals which have not as yet been processed are called "unresolved.")

In decision block 120, all methods which achieve to the current GOAL are consecutively tested (i.e. tested one after another) to determine if any of them have not as yet been examined (as described below). The METHODS are referenced by the "SET *methods" field of the GOAL data structure for the current GOAL. If this test results in a YES, then the algorithm 100 flows next to block 122 where the next unexamined METHOD is fetched from memory 40 (FIG. 2).

Following this, in block 124, the fetched METHOD for the current GOAL is examined, i.e., the resulting total stress currents on all stressed parts of the BUT are calculated, as described above, based on conditions which would prevail if the method corresponding to that METHOD record were chosen for implementation. This calculation uses the values of $I_{osh}$ and $I_{osl}$ which are associated with the fetched method and stored in the "Iosh" and "Iosl" fields of the corresponding STRESSED LEAD record. The calculated HIGH and LOW total stress currents carried by all leads of each DUT part are stored in the respective "Iosh_Sum" and "Iosl_Sum" fields of the corresponding STRESSED PART record.

Along with the stress currents, the number of nodal conflicts is calculated for the fetched METHOD in block 124. A conflict arises when the logic state of the current GOAL required to implement the method of the fetched METHOD record is not compatible with the logic state to which the current GOAL must be driven by the drive signals in order to run the test or in order to implement chosen methods of isolation that have already been selected. Computed holding node conflicts are stored in the NODAL CONFLICT table.

After completing these calculations for the fetched METHOD, the algorithm 100 loops back to the decision block 120, as indicated by line L-1, until all METHODS for the current GOAL have been examined. If there are no more METHODS left unexamined, the test of decision block 120 produces a NO, and the process of generating the optimal isolation methods next proceeds to block 126.

In decision block 126, the now-examined METHODS for the current GOAL are tested to assure that not all produce excessive backdrive stress. For this, the contents of each Iosh_sum and Iosl_sum field stored in the STRESSED PART data structure for each stressed part is compared with the upper safe threshold of total stress current, "$I_{MAX}$," that is stored in the MAX_I field of the STRESS PART data structure for that part. (As mentioned above, in accordance with the invention, $I_{MAX}$ typically is equal to 1 ampere, although the test operator can determine empirically or sometimes from manufacturers' specifications that an even higher value can be used, in which case this higher value would be placed in the MAX_I field and used in this test). If not all methods produce excessive stress, as indicated by the backdriving currents being below the $I_{MAX}$ threshold, the test of block 126 produces a NO, and next the algorithm 100 goes to block 128.

In block 128, the algorithm selects from among the methods which do not produce excessive total stress current, the method yielding the fewest nodal conflicts. The METHOD record corresponding to this selected method is called the Chosen METHOD and is so identified by having its Method Id stored in the "int chosen" field of the GOAL data structure for the current GOAL. Also, a POSITIVE ONE is entered in the "int chosen" field of the METHOD data structure at a location corresponding to the GOAL id for the current GOAL that is contained in the "SET *goals" field.

Now, the "int chosen" fields of all other METHODS that are listed in the NODAL CONFLICT data structure (including, among others, other examined methods) will be set appropriately with a NEGATIVE ONE, ZERO or POSITIVE ONE to indicate for each, for the current GOAL, that the METHOD was either rejected, neither accepted nor rejected (since further processing in algorithm 100 is necessary), or accepted, respectively.

Returning the discussion to decision block 126, if, on the other hand, all available methods for the current GOAL result in excessive total stress current, i.e., the test performed in decision block 126 generates a YES, then the algorithm 100 goes to block 134. There, the METHOD which results in the lowest total stress current is selected as the chosen METHOD. Since this chosen METHOD, if implemented, would result in total stress current above the safe threshold for the stressed part, the nodes that are connected to the part's outputs are added to the list of TARGET nodes in block 136. In other words, the TARGETS will now include not only nodes which are to be protected since they are inputs to the DUT's, but also those nodes which must be protected because of unintended effects of the chosen METHOD for the current GOAL.

Since the list of TARGETS is thus expanded, so too must the list of METHODS be updated, since, with a change in TARGETS, additional goals probably must be controlled, and a different set of METHODS might be available to provide that control. Consequently, the GOALS probably are no longer sorted in the proper order. Therefore, in block 136, the algorithm 100 also sets a flag to indicate that the Goals are no longer sorted, i.e., "NOT SORTED" equals true. To handle this, the algorithm 100 returns over line L-2 to the "GOALS Finished or not Sorted?" decision block 116, and since the GOALS are no longer sorted, this decision generates a YES. This returns the program over line L-3 to the "GOALS finished?" decision block 112 and the ensuing block 114 where GOAL re-sorting occurs.

After blocks 128 and 136, the program returns over line L-2 to decision block 116, where, if not all GOALS have been resolved, i.e., have corresponding chosen METHODS, the test produces a NO and the program flows again to block 118 to select the next-highest-priority, unresolved GOAL for processing as a new Current GOAL, as described above. If the GOALS must be re-sorted, as indicated by the flag set in block 136, the test of block 116 again produces a NO, and the algorithm 100 goes again to block 114, and sorting and processing proceed as described above. If all GOALS have been resolved, i.e., the GOALS are finished, the test of block 116 produces a YES and the program loops back over line L-3 to the "GOALS Finished?" decision block 112, and thence, due to a YES result, over line L-4 to block 140.

In block 140, the algorithm 100 initializes a variable called "GLOBAL MAXTIME," e.g., to 10 milliseconds. GLOBAL MAXTIME is the shortest MAXTIME for any of the chosen methods. As noted above, MAXTIME is the maximum length of time the chosen method can be safely run for a part without overheating the part, more specifically, without overheating the $V_{cc}$ and ground bond wires in the part.

After block 140, a loop is entered in which the total stress current resulting from the implementation of all the chosen methods is calculated for each stressed part, and the GLOBAL MAXTIME is determined. This loop begins with decision block 142, in which the algorithm 100 chooses a next stressed part as the "current stressed part," i.e., the subject of the calculations for the next pass through the loop.

Then, in block 144, the total stress current that would flow in the current stressed part if all the chosen methods were implemented is calculated, as described above, and is stored in the appropriate Iosh-sum or Iosl-sum fields of the STRESSED PART record for the current stressed part. In addition, the MAXTIME for implementing the chosen methods with respect to the current stressed part is calculated, as described above, and stored in the MAX-TIME field of the STRESSED PART record for the current stressed part.

In block 146, the algorithm 100 determines whether the total stress currents calculated in block 144 produce excessive stress on the current stress part by comparing them with the upper threshold for stressed currents stored in the MAX-I field, as described above. If the computed stressed currents for the current stressed part are excessive, i.e., exceed the MAX-I threshold, the test of block 146 produces a YES, and the algorithm 100 proceeds to block 148 wherein this result is noted by setting the entry for the current stressed part in the set *stress-part field of the REPORT-RESULTS data structure in memory 16a.

After block 148, or if the test of block 146 produces a NO, then the algorithm 100 proceeds to block 150. In block 150, the MAXTIME for the current stressed part is compared with all previously-computed MAX-TIMES for other stressed parts in block 150. If the computed MAXTIME for the current stressed part is the shortest, the GLOBAL MAXTIME field of the REPORT-RESULTS data structure is set in block 152 to equal this value. Afterwards, or if it is not the shortest value, the algorithm 100 returns over line L-5 to block 142. There, the algorithm 100 fetches the next stressed part for processing as the current stressed part, as described above.

If all stressed parts have been processed, the test of block 142 indicates this and the algorithm 100 ends.

Subsequently, the processor 16 of FIG. 2 can issue a report of the results of the algorithm 100 over the user interface 18. The report can include the contents of the REPORT-RESULTS record, i.e., the identification of which, if any, of the stressed parts would have excessive total stress currents if the chosen methods were implemented, and the value of the GLOBAL MAXTIME, i.e., the maximum safe time the test can be permitted to run. Based on this report, the test operator then can intervene, as required, to assure the test is safely run.

For example, if any BUT parts were identified as being subject to excessive stress if the test were implemented with the chosen methods, the operator can introduce new methods of isolation, e.g., inhibits, disables, H-forces, and/or L-forces, for particular nodes (i.e., change the contents of the in-circuit model 24 (FIG. 2), and re-run the algorithm 100. This is a viable option in many cases since the determination of which methods are available for isolation, and, therefore, included in the in-circuit model 24, is made with a tendency to exclude any methods which have a non-insignificant chance of damaging the BUT. Many of the excluded methods, however, carry a sufficiently low risk of damage that they can be used when necessary for testing, i.e., they have an acceptably low risk. The operator therefore may choose additional methods not previously examined which are less conservative but nonetheless unlikely to damage the BUT. Also, the operator can elect to revise upwardly the MAX-I value, if the operator deems that value to be too conservative. A further alternative is for the operator to divide the test into subtests that can be successfully run.

If, on the other hand, the total stress and calculated run time are within allowable limits, the Chosen METHODS are fed to the test controller 19 (FIG. 2) and the test can proceed using the isolation protocol thus computed.

The foregoing description has been limited to a specific embodiment of this invention relating to in-circuit testing. It will be apparent, however, that adaptations, variations and modifications may be made to the invention, with the attainment of some or all of the advantages of the invention. For example, the invention can be practiced in functional testing of entire printed circuit boards, or in cluster testing of portions of printed circuit boards. Therefore, it is the object of the appended claims to cover all such adaptations, variations and modifications as come within the true spirit and scope of the invention.

What is claimed is:

1. A method for testing a circuit ("BUT") having a plurality of digital devices and a plurality of nodes electrically connecting the devices, said method comprising:
   A) applying drive signals to a plurality of the nodes of the BUT;
   B) monitoring responses to the drive signals from a plurality of the nodes of the BUT; and
   C) prior to applying the drive signals, generating an isolation protocol for use in testing the circuit, the isolation protocol including a plurality of isolation methods each for isolating at least one of the devices, each method comprising a specification of the drive signals and an identification of the nodes to which the drive signals are to be applied, said protocol-generating step comprising selecting, from a plurality of available isolation methods, a combination of methods to be used in testing the circuit, said selecting step including
      i) calculating estimated levels of stress currents in the devices which would result from implementing each of the available methods of isolating the devices, and
      ii) choosing a combination of available methods resulting in calculated stress currents below a pre-selected level.

2. The method of claim 1, wherein the testing comprises in-circuit testing.

3. The method of claim 1, wherein the testing comprises cluster testing.

4. A method of testing an electrical circuit ("BUT"), said BUT comprising a plurality of circuit elements, said circuit elements being electrically connected by a plurality of nodes, said method comprising the steps of:
   A) providing a library of available methods of isolating pre-selected ones of the circuit elements;

B) using a processor to select which of the methods to use in running the test by
   i) calculating a plurality of stress currents in said circuit elements resulting from each of a plurality of the available methods, and
   ii) selecting a combination of the available methods yielding calculated stress currents below a pre-selected level; and
C. running the test using the selected combination of available methods.

5. The method of claim 4 wherein the circuit elements each comprise a plurality of electronic components, and the running of the test comprises the steps of:
   A) applying drive signals to the BUT for energizing selected electronic components, and for isolating other electronic components using the selected methods; and
   B) detecting response signals from the BUT.

6. The method of claim 4 wherein the circuit elements each comprise a plurality of circuits of the BUT, and the running of the test comprises the steps of:
   A) applying drive signals to the BUT for energizing selected circuits, and for isolating other circuits using the selected methods; and
   B) detecting response signals from the BUT.

7. The method of claim 4 wherein the selecting step further comprises:
   i) calculating the number of holding conflicts resulting from each of a plurality of combinations of the available methods; and
   ii) identifying the combination of the available methods yielding a number of calculated holding conflicts below a pre-selected level.

8. The method of claims 4 wherein the selecting step further comprises:
   i) calculating, for each of a plurality of combinations of the available methods, the length of time the test can be run safely if the methods were implemented; and
   ii) determining whether the test can be run within the calculated length of time.

9. The method of claim 4 further comprising the step of generating records associated with selected nodes to be protected, selected nodes to be controlled, the methods available to achieve the isolation, and the results of the stress currents calculations.

10. An apparatus for testing an electrical circuit, said electrical circuit comprising a plurality of circuit elements electrically connected by a plurality of nodes, said apparatus comprising:
    A) library means for providing a library of available methods of isolating pre-selected circuit elements;
    B) a processor coupled with said library means for selecting the methods to be used in testing the electrical circuit by
       i) calculating the stress currents in the circuit elements that would result from implementing the available methods, and
       ii) selecting the combination of the available methods yielding calculated stress currents below a pre-selected level; and
    C) test means coupled with said processor for applying drive signals selectively to, and detecting response signals selectively from said electrical circuit in accordance with said selected combination of available methods, and thereby testing the electrical current.

11. The apparatus of claim 10 wherein the circuit elements each include a plurality of electronic parts, and said test means comprises:
    A) means for applying drive signals to the electrical circuit for energizing selected electronic parts, and for isolating other electronic parts using the selected methods; and
    B) means for detecting response signals from the electrical circuit.

12. The apparatus of claim 10 wherein the circuit elements each include a plurality of electrical circuits comprising the electrical circuit, each circuit including a plurality of electronic parts, and said test means comprises means for applying drive signals to the electrical circuit for energizing selected circuits, and for isolating other circuits using the selected methods; and means for detecting response signals from the electrical circuit.

13. The apparatus of claim 10 wherein said processor:
    i) calculates the number of holding conflicts resulting from each of a plurality of combination of the available methods; and
    ii) identifies a combination of the methods yielding a number of calculated holding conflicts below a pre-selected level.

14. The apparatus of claim 10 wherein said processor:
    i) calculates, for each of a plurality of combinations of the available methods, the length of time the test would take if the combination were implemented, and
    ii) identifies a combination of available methods yielding a length of time below a pre-selected limit.

15. The apparatus of claim 10 wherein said processor generates records associated with the methods available to achieve the isolation including selected nodes to be protected, and selected nodes to be controlled, and the results of the stress currents calculations.

16. An apparatus for testing a circuit provided by a printed circuit board ("BUT") having a plurality of circuit elements and a plurality of nodes connecting the circuit elements, comprising:
    A) means for applying drive signals to the BUT;
    B) means for monitoring responses to the drive signals from the BUT;
    C) means coupled to said signal applying means for controlling the signals applied to the BUT; and
    D) means coupled to said signal controlling means for computing the drive signals including means for generating an isolation protocol for use in testing the circuit, said generating means comprising means for selecting, from a plurality of available isolation methods, a combination of methods to be used in testing the circuit, by
       i) calculating estimated levels of stress currents in a plurality of the circuit elements which would result from implementing each of a plurality of the available methods, and
       ii) choosing those of the available methods which each results in calculated stress currents below a pre-selected level.

17. The apparatus of claim 16, wherein the testing comprises in-circuit testing.

18. The apparatus of claim 16, wherein the testing comprises cluster testing.

19. An apparatus for generating an isolation protocol for use in testing an electrical circuit ("BUT"), said apparatus comprising:
    A) a first memory for storing a device library including a plurality of section records each indicating at least one available method of isolating each of a plurality of electrical elements comprising said BUT;

B) a second memory for storing a BUT-description library comprising a plurality of records providing information on the topology of the BUT;

C) a processor coupled to said first and second memories for selecting a combination of methods for use in isolating the circuit elements during testing of the BUT, by calculating, for each of a plurality of methods, an estimate of the stress currents that would result if that available method were implemented during the testing, and selecting those of the methods which each result in calculated stress currents below a pre-selected level.

20. The apparatus of claim 19 wherein the electrical elements include a plurality of digital devices, each having a $V_{cc}$ and ground bond wire, and said processor calculates the stress current flowing through the $V_{cc}$ and ground bond wires of the digital devices.

21. The apparatus of claim 19, wherein said processor calculates an estimate for the maximum safe length of time in which the selected methods can be implemented with respect to each.

22. The apparatus of claim 21 wherein said processor calculates the length of time substantially in accordance with the following equation:

$$\text{MAXTIME} = (T/k)\,[1/(I_b)^2]$$

wherein "MAXTIME" is the length of time, "T" is the maximum allowable temperature, "k" is a constant, and "$I_b$" is the total stress current on the part.

23. The apparatus of claim 19 wherein said processor makes the calculations of stress currents in a selected order corresponding to a priority assigned to the reason for isolating the electrical element in which the stress current is flowing.

* * * * *